(12) United States Patent
Doare et al.

(10) Patent No.: US 9,350,381 B1
(45) Date of Patent: May 24, 2016

(54) CIRCUIT GENERATING AN ANALOG SIGNAL USING A PART OF A SIGMA-DELTA ADC

(71) Applicants: Olivier Vincent Doare, La Salvetat St Gilles (FR); Rex Kenton Hales, Mesa, AZ (US)

(72) Inventors: Olivier Vincent Doare, La Salvetat St Gilles (FR); Rex Kenton Hales, Mesa, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 14/715,022

(22) Filed: May 18, 2015

(30) Foreign Application Priority Data

Dec. 16, 2014 (WO) ... INTELL PCT/IB2014/003067

(51) Int. Cl.
*H03M 1/10* (2006.01)
*H03M 3/00* (2006.01)

(52) U.S. Cl.
CPC ............. *H03M 3/39* (2013.01); *H03M 3/378* (2013.01)

(58) Field of Classification Search
CPC ... H03M 3/378; H03M 3/458; H03M 1/1071; H03M 1/109; H03M 1/1095
USPC .......................................... 341/120, 143, 155
See application file for complete search history.

(56) References Cited

U.S. PATENT DOCUMENTS

| | | | | |
|---|---|---|---|---|
| 5,068,657 A | * | 11/1991 | Tsai ....................... | H03M 3/378 341/120 |
| 5,341,135 A | * | 8/1994 | Pearce ................. | H03M 7/3006 341/120 |
| 5,659,312 A | * | 8/1997 | Sunter ................... | H03M 1/109 341/120 |
| 5,909,186 A | * | 6/1999 | Gohringer ........... | H03M 1/1071 341/120 |

(Continued)

FOREIGN PATENT DOCUMENTS

WO 2006012503 2/2006

OTHER PUBLICATIONS

Cherry, James A., "Continuous-time Delta-Sigma Modulators for High-Speed A/D Conversion: Theory, Practice and Fundamental Performance Limits", Kluwer Academic Publishers, ISBN 0-7923-8625-6, p. 2.

(Continued)

*Primary Examiner* — Khai M Nguyen
(74) *Attorney, Agent, or Firm* — Charles R. Jacobsen

(57) ABSTRACT

The circuit generates an analog output signal which may be used to test a sigma-delta ADC. A digital waveform generator supplies a digital signal to a DAC to convert the digital signal into an analog signal. A filter filters the analog signal to obtain the analog output signal. The DAC is a DAC of a sigma-delta ADC and the filter comprises a filter of the sigma/delta ADC. A multiplexer 34 supplies the digital signal to the DAC in a generator mode wherein the circuit converts the digital signal into the analog output signal using the part of the sigma-delta ADC, or to supply a quantized analog output signal to the DAC in normal mode wherein the sigma-delta ADC converts its analog input signal into the quantized analog output signal.

20 Claims, 5 Drawing Sheets

(56) References Cited

U.S. PATENT DOCUMENTS

| | | | |
|---|---|---|---|
| 6,184,810 B1 | 2/2001 | Burns | |
| 6,259,389 B1 | 7/2001 | McGrath | |
| 6,449,569 B1 | 9/2002 | Melanson | |
| 6,907,374 B1 | 6/2005 | Tsyrganovich | |
| 7,062,401 B1 * | 6/2006 | McGrath | H03M 1/1095 341/120 |
| 7,271,751 B2 | 9/2007 | Peterson et al. | |
| 7,327,152 B2 | 2/2008 | Fischer et al. | |
| 7,327,153 B2 | 2/2008 | Weintraub et al. | |
| 7,428,683 B2 | 9/2008 | Dai et al. | |
| 8,310,385 B2 | 11/2012 | Dasnurkar | |
| 8,378,865 B2 * | 2/2013 | Zhang | H03M 1/109 341/118 |
| 8,830,098 B2 * | 9/2014 | Mir | H03M 3/378 341/120 |
| 2007/0176807 A1 | 8/2007 | Mattes et al. | |
| 2008/0158028 A1 | 7/2008 | Yang et al. | |
| 2010/0328121 A1 | 12/2010 | Hamilton | |
| 2012/0075130 A1 | 3/2012 | Zhang | |
| 2013/0201046 A1 | 8/2013 | Mir et al. | |

OTHER PUBLICATIONS

Schreier, Richard et al., "Understanding Delta-Sigma Data Converters", IEEE Press, ISBN 978-0-471-46585-2, p. 415.

Chouba, N. et al., "A BIST Architecture for Sigma Delta ADC Testing Based on embedded NOEB Self-Test and CORDIC Algorithm", 2010 International Conference on Design and Technology of Integrated Systems in Nanoscale Era; Mar. 23-25, 2010; 7 pages.

Hung, S. et al., "A Fully Integrated Built-in Self-Test Σ-Δ ADC on a Wireless Test Platform", 2011 IEEE 17th International Mixed-Signals, Sensors and Systems Test Workshop, May 16-18, 2011; pp. 78-81.

Hong, H. et al., "A Fully Integrated Built-In Self-Test Σ-Δ ADC Based on the Modified Controlled Sine-Wave Fitting Procedure", IEEE Transactions on Instrumentation and Measurement, vol. 59, issue 9; Dec. 15, 2009; pp. 2334-2344.

Ong, C. et al., "Self-Testing Second-Order Delta-Sigma Modulators Using Digital Stimulus", Proceedings 20th IEEE VLSI Test Symposium, Jan. 2002; pp. 123-128.

Hung, S. et al., "A Low-Cost Output Response Analyzer for the Built-in-Self-Test Σ-Δ Modulator Based on the Controlled Sine Wave Fitting Method", IEEE 2009 Asian Test Symposium; Nov. 23-26, 2009; pp. 385-388.

U.S. Appl. No. 14/715,022, filed May 16, 2015, entitled "A Circuit Generating an Analog Signal Using a Part of a Sigma-Delta ADC".

Notice of Allowance mailed Dec. 7, 2015 for U.S. Appl. No. 14/714,946, 9 pages.

* cited by examiner

CIRCUIT GENERATING AN ANALOG SIGNAL USING A PART OF A SIGMA-DELTA ADC

CROSS REFERENCE TO RELATED APPLICATION(S)

The present application claims priority to International Patent Application No. PCT/IB2014/003067, entitled "A CIRCUIT GENERATING AN ANALOG SIGNAL USING A PART OF A SIGMA-DELTA ADC," filed on Dec. 16, 2014, and is related to co-pending U.S. patent application Ser. No. 14/714,946, entitled "TEST SIGNAL GENERATOR FOR SIGMA-DELTA ADC," filed on May 18, 2015, the entirety of which are herein incorporated by reference.

Field of the Invention

This invention relates to a circuit for generating an analog output signal by using a part of a sigma-delta ADC in a generator mode or for operating as a sigma-delta ADC in a normal mode, a system comprising the circuit for generating the analog output signal in a generator mode or for operating as a sigma-delta ADC in a normal model and a further circuit comprising an input for receiving the analog output signal, and a method of generating an analog output signal by using a portion of a sigma-delta ADC in a generator mode or for performing a sigma-delta ADC operation in a normal mode.

BACKGROUND OF THE INVENTION

The international application WO2006/012503A2 discloses a BIST (Build In Self Test) scheme for functionality tests of analog circuitry such as frequency response, gain, cut-off frequency, signal-to-noise ratio and linearity measurement. The BIST scheme utilizes a built-in direct digital synthesizer (which in the following is referred to as DDS) as the test pattern generator which can generate various test waveforms such as chirp, ramp, step frequency, two-tone frequencies, sweep frequencies, MSK (Minimum Shift Keying), phase modulation, amplitude modulation, QAM (Quadrature Amplitude Modulation) and other hybrid modulations. A digital to analog converter (DAC) converts the digital test signals into an analog test signal to be supplied to the analog device under test (which in the following is referred to as DUT). The BIST scheme utilizes a multiplier followed by an accumulator as the output response analyser.

The publication "A BIST Architecture for Sigma Delta ADC testing Based on Embedded NOEB Self-Test and CORDIC Algorithm" of N. Chouba and L. Bouzaida at 2010 International Conference on Design & Technology of Integrated Systems in Nanoscale Era, IEEE Conference Publications 10.1109/DTIS.2010.5487558 (978-1-4244-6340-4/10) discloses a BIST architecture for testing a sigma-delta ADC. The BIST architecture comprises a binary stream generator which generates a 2252 bits periodic binary sinusoidal stimulus to be supplied to the analog input of the sigma-delta ADC to be tested. A CORDIC generates the reference signal to be used by the modified sine wave fitting in comparing the digital output signal of the sigma-delta ADC with the reference signal.

These prior art test signal generators require a significant amount of extra chip area,

SUMMARY OF THE INVENTION

The present invention provides a circuit for generating an analog output signal by using a part of a sigma-delta ADC in a generator mode or for operating as a sigma-delta ADC in a normal mode, a system comprising the circuit for generating the analog output signal in a generator mode or for operating as a sigma-delta ADC in a normal mode and a further circuit which uses the output signal as its input signal and a method of generating the analog output signal in a generator mode or for performing a sigma-delta ADC operation in a normal mode as described in the accompanying claims.

Specific embodiments of the invention are set forth in the dependent claims. In an embodiment, the analog output signal may be a test signal for testing the further circuit. In an embodiment, the further circuit may be a further sigma-delta ADC.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

If in the following, for sake of understanding, the circuitry is described in operation, it will be apparent that the respective elements are arranged to perform the functions being described as performed by them.

Figure 1:
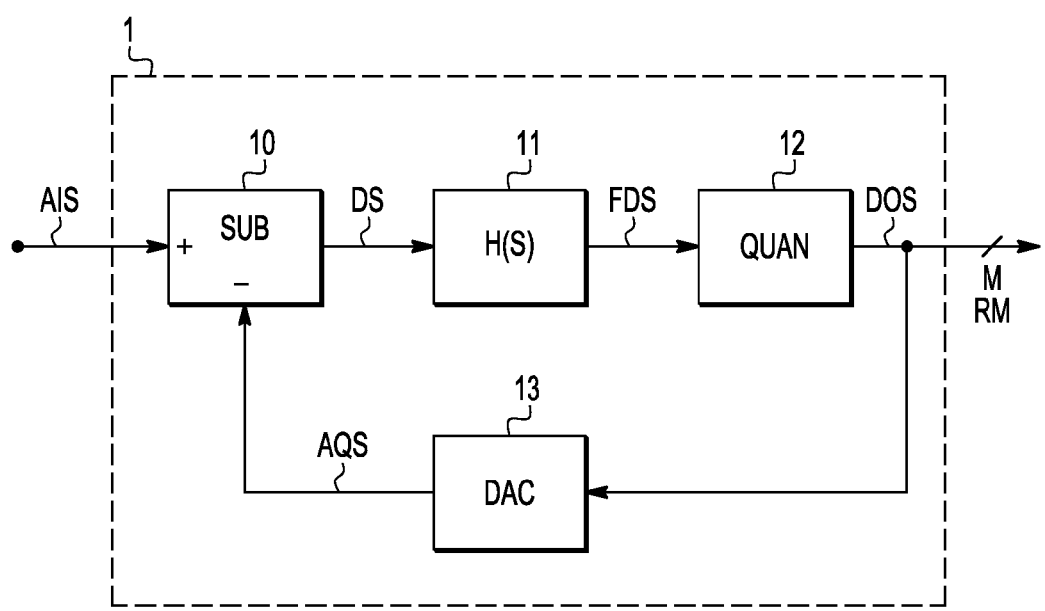
FIG. 1 schematically shows an example of a sigma-delta ADC.

FIG. 1 schematically shows an example of a sigma-delta ADC. The sigma-delta ADC comprises an analog portion 1. Usually, the sigma-delta ADC further has a digital portion (not shown) which may comprise digital decimation filter(s). The digital portion is not further discussed here because it is not relevant to the present invention. The analog portion 1 converts the analog input signal AIS into the digital data stream DOS.

The analog portion 1 comprises a subtractor 10, a filter 11, a quantizer 12 and a DAC 13. The subtractor 10 has a non-inverting input to receive the analog input signal AIS and an inverting input to receive the analog quantized signal AQS supplied by the DAC 13. The subtractor 10 supplies the difference signal DS to the filter 11. The filter 11 supplies the filtered difference signal FDS to the quantizer 12 which supplies the digital data stream DOS to the digital portion 2 and to the DAC 13. The subtractor 10 need not be a separate circuit but for example may be a subtraction function performed by opamp(s) of the filter 11.

It is common practice that the filter 11 of the sigma-delta ADC has integrating properties, however that is not mandatory. In general, sigma-delta modulators require some function H(s) to create the transfer function for the ADC. For example, H(s) may be defined as in FIG. 1.2 and equation 1.1 of "Continuous-time Delta-Sigma Modulators for High-Speed ND Conversion", James Cherry, Martin Snelgrove, Kluwer Academic Publishers, ISBN 0-7923-8625-6, page 2, by $Y(s)=U(s)*(H(s)/(1+H(s)))+E(s)/(1+H(s))$. This equation shows that the signal transfer function $U(s)*(H(s)/(1+H(s)))$ can be separated from the quantization noise transfer function $E(s)/(1+H(s))$. For sufficient large H(s) the result is $Y(s)=U(s)$, independent on what H(s) actually is. An example of a filter 11 which is an integrator is the known CRFF structure as described in "Understanding Delta-Sigma Data Converters"—Richard Schreier, Gabor C. Temes, IEEE Press, ISBN 978-0-471-46585-2, page 415). Such a CRFF structure may comprise a third order continuous time feed forward cascade of resonators, such as three cascaded integrators with a resistor feeding a signal from the output of the second integrator back to the input of the first integrator.

The quantizer 12 may supply the digital data stream DOS as M bit data words wherein M is an integer >=1. The DAC 13 converts the M bit data words into the analog quantized signal AQS. The sample rate of the quantizer 12 and the DAC 13 should at least be higher than two times the highest frequency in the analog input signal AIS. However, in the sigma-delta ADC shown in FIG. 1, to improve performance, the sample rate may be selected higher such that oversampling occurs and decimation by the decimation filters (not shown) in the digital portion 2 is possible.

It has to be noted that the construction of the digital portion is only discussed herein as far as relevant for the present invention.

It has to be noted that the sigma-delta ADC shown in FIG. 1 is only an exemplary embodiment. The circuit which generates the analog output signal in accordance with the invention and which is described with respect to FIG. 2, may be used for testing any possible architecture of a sigma-delta ADC. If the analog output signal ATS is used as an analog test signal to test a sigma-delta ADC, the analog output signal ATS has to fit the input range of the sigma-delta ADC to be tested. The circuit which generates the analog output signal may be integrated in the same chip as the sigma-delta ADC to be tested. Alternatively or additionally, the high quality analog output signal ATS may be used to test any other circuit on the same chip or any circuit outside the chip.

Figure 2:
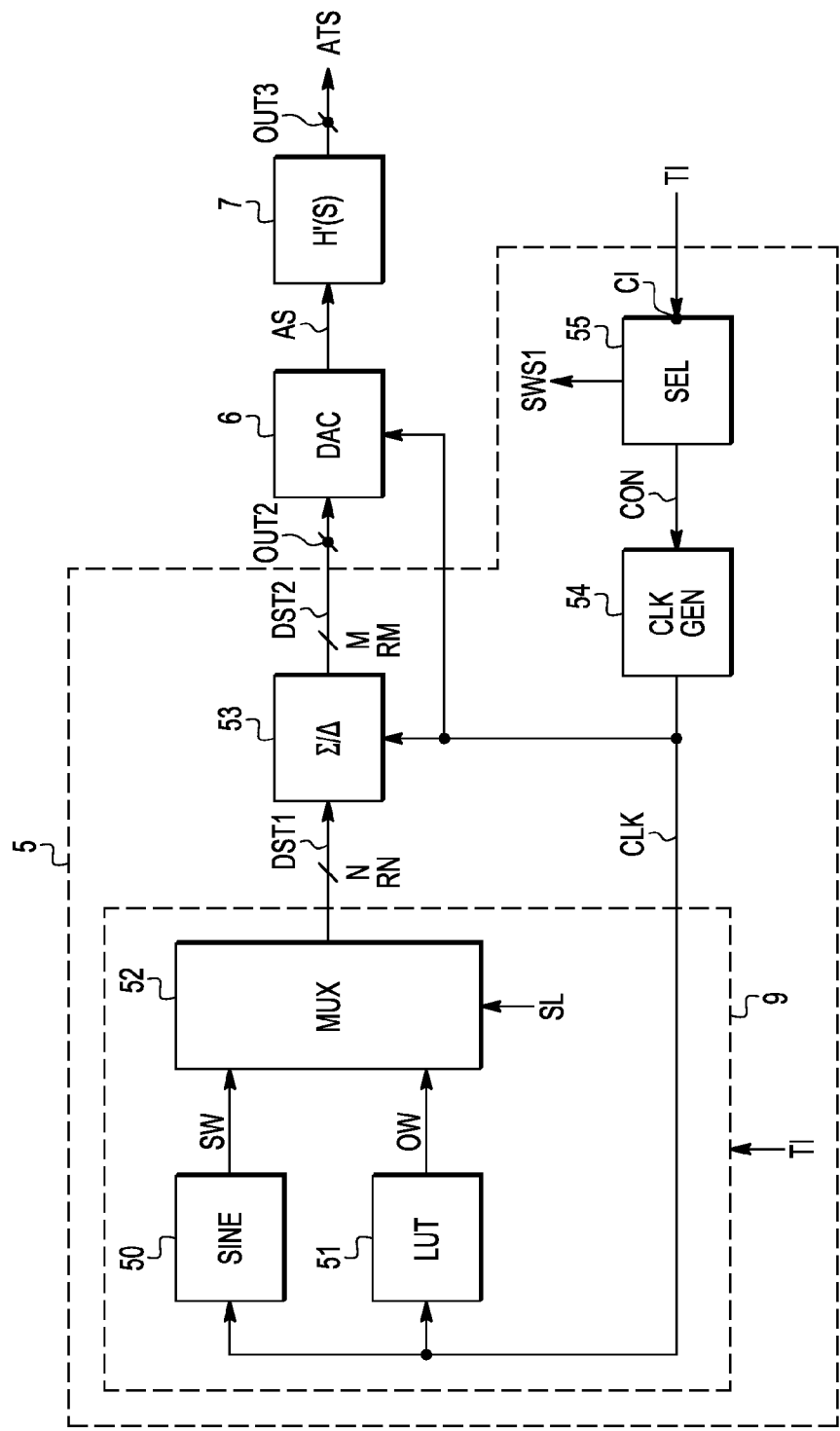
FIG. 2 schematically shows an embodiment of a circuit which generates an analog output signal which may be used to test a sigma-delta ADC, FIG. 3 schematically shows an embodiment of a system which comprises the sigma-delta ADC and the circuit which uses part of this sigma-delta ADC to generate the analog output signal, FIG. 4 schematically shows a more detailed block diagram of an embodiment of the circuit which generates the analog output signal using the filter of a sigma-delta ADC, and FIG. 5 schematically shows a block diagram of two sigma-delta ADC's, a portion of one of the sigma-delta ADC's is used in the circuit which generates the analog output signal to obtain the analog test signal suitable to test the other sigma-delta ADC.

FIG. 2 schematically shows an embodiment of a circuit which generates the analog output signal which may be used to test a sigma-delta ADC. The circuit which generates the analog output signal ATS comprises a digital waveform generator 5, an optional digital sigma delta modulator 53, a DAC 6, a filter 7, a clock generator 54 and a selection controller 55.

The embodiment of the digital waveform generator 5 which is shown in FIG. 2 may be of any construction suitable to supply a digital test signal DTS2 with M bit words and sample rate RM. The number of bits M may be controlled by adapting the amplitude of the digital test signal DTS2, the sample rate RM may be controlled by adapting the clock signal CLK supplied by the clock generator 54 to the digital waveform generator 5. The selection controller 55 supplies the control signal CON and the switch signal SWS1 in response to the test signal select signal TI. The control signal CON controls the frequency of the clock signal CLK. The switch signal SWS1 indicates whether the sigma-delta ADC of which the parts are used is operating in a normal mode wherein it acts as a sigma-delta ADC or in a generator mode wherein the DAC and filter (may be slightly adapted) of the sigma-delta ADC are used to convert the digital signal DTS2 into the analog output signal ATS.

In an embodiment, the digital waveform generator 5 may comprise a sine wave generator 50, a LUT (Look Up Table) 51, and a multiplexer 52. The sine wave generator 50 may be based on the CORDIC algorithm known from "A BIST Architecture for Sigma Delta ADC Testing Based on embedded NOEB Self-Test and CORDIC Algorithm, IEEE Conference Publications 10.1109/DTIS.2010.5487558". Alternatively, or additionally, the required digital test signals may be stored in a LUT 51. In the embodiment shown in FIG. 2, the LUT 51 may contain digital data representing ramp or triangular shaped signals, sinusoidal signals, DC levels, any other suitable test signals, or any pre-programmed sequence of such signals and levels. However, such signals may be generated in any other suitable manner without using a LUT. For example, a counter may count clock pulses to obtain a ramp signal. The sine-wave generator 50 supplies the digital sine-wave SW and the LUT 51 supplies the waveform OW to the multiplexer 52 which is controlled via the selection signal SL to output the desired one of these waveforms SW or OW to the sigma-delta modulator 53 of the digital waveform generator 5. The selection signal SL may also be supplied to the LUT 51 to select the desired stored waveform or to the sine wave generator 50 to change the digital sine wave. It has to be noted that the manner in which the digital test signal DTS2 is generated is not important for the invention as long as the number of bits and the sample rate is selected such that the analog output signal ATS has the desired characteristics.

In the embodiment shown in FIG. 2 the digital sigma-delta modulator 53 is optional and may be implemented to convert the digital signal DTS1 with words having N bits and with sample rate RN supplied by the multiplexer 52 into the digital test signal DTS2 which has M<N bit words and a sample rate RM>RN. The number M and the sample rate RM may be selected to be equal to the number of bits and the sample rate, respectively, of the digital data stream DOS as occurring in the analog portion 1 of the sigma-delta ADC shown in FIG. 1. This approach may be implemented if the digital waveform generator 5 generates digital words with a number of bits (for example 16) which is higher than the number of bits processed by the DAC 6 which may be the DAC 13 of the sigma-delta ADC shown in FIG. 1. Alternatively, if the digital waveform generator 5 generates digital words with the correct format (number of bits and bit rate) as is required by the DAC 6, the sigma-delta modulator 53 can be omitted.

The digital waveform generator 50, 51, 52 and the sigma-delta modulator 53 together are referred to as the digital waveform generator 5 which is able to produce the digital test signal DTS2 which is required to generate the analog output signal ATS which is suitable for testing a sigma-delta ADC. The digital waveform generator 5 supplies the digital signal DTS2 at an output OUT2.

The DAC 6 and the filter 7 generate the analog output signal ATS (which is also referred to as the analog test signal if it is used for testing a circuit) which may be used as the analog input signal AIS of the sigma-delta ADC to test its analog portion 1 (see FIG. 1). If the digital test signal DTS2 has a format (number of bits and sample rate) identical to the format of the digital data stream DOS in the sigma-delta ADC of FIG. 1 and the DAC 6 performs the same operation as DAC 13 in the sigma-delta ADC shown in FIG. 1, the resulting analog signal AS supplied by the DAC will be equal in quality to the analog quantized signal AQS occurring in the sigma-delta ADC of FIG. 1. After filtering the analog signal AS by the filter 7 with transfer function H'(S) at the output OUT3 a high quality analog test signal ATS results which can be used as the analog input signal AIS. As will be elucidated with respect to FIG. 4, the transfer function H'(s) can be obtained by minor modification of the transfer function H(s) of the sigma-delta ADC shown in FIG. 1. Briefly said, the integrating function of H(s) has been changed into a low pass filter function of H'(s). The transfer function H'(s) may even be identical to the transfer function H(s). The frequency of the clock signal CLK should be selected to be sufficiently high such that the control of the clock frequency to obtain the correct sample rate of the digital signal DTS2 will not influence the quality of the analog test signal ATS.

Although the digital signals DTS1 and DTS2 are often referred to as test signals, it actually might be just digital input signals leading to the analog output signal which is not used for test purposes but as an input signal for another circuit.

Figure 3:
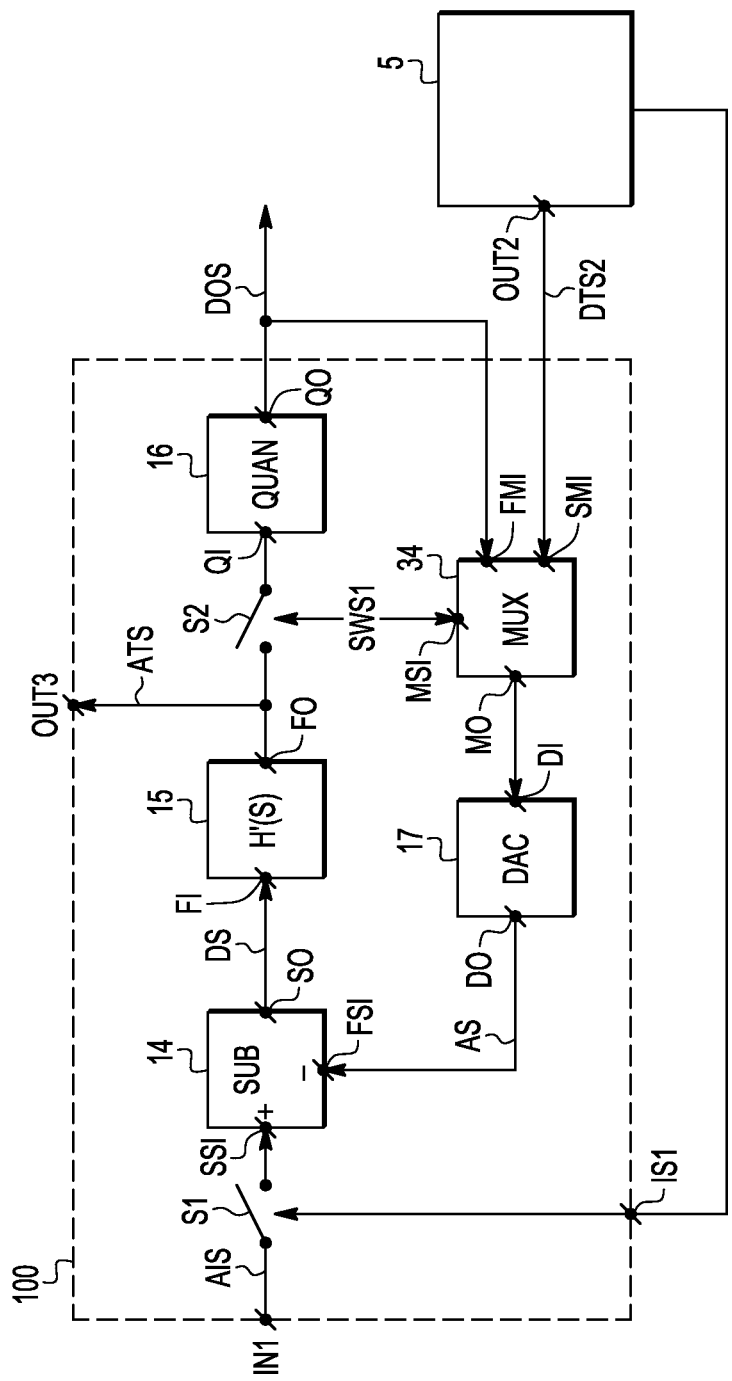

FIG. 3 schematically shows an embodiment of a system which comprises a sigma-delta ADC and the circuit which uses part of this sigma-delta ADC to generate an analog output signal. The analog output signal ATS is a high quality analog signal which for example may be a test signal suitable for testing the sigma-delta ADC.

The circuit for generating an analog output signal by using a part of a sigma-delta ADC comprises: a digital waveform generator 5 having a generator output OUT2 for supplying a digital signal DTS2, and a the sigma-delta ADC 100 comprising: an ADC input IN1 for receiving an analog input signal AIS, a switch input IS1 for receiving a first switch signal SWS1, an analog filter 15 comprising a filter input FI, and a filter output FO for supplying an analog filtered signal ATS, a quantizer 16 comprising a quantizer input QI coupled to the filter output FO for receiving the analog filtered signal ATS and a quantizer output QO for converting the analog filtered signal ATS into a digital data stream DOS, a DAC 17 comprising a DAC input DI and a DAC output DO, a subtractor 14 comprising a first subtractor input FSI coupled to the DAC output DO, a second subtractor input SSI coupled to the ADC input IN1 via a first switch 51 and a subtractor output SO being coupled to the filter input FI, and a multiplexer 34 comprising a first multiplexer input FMI coupled to the quantizer output QO for receiving the digital data stream DOS, a second multiplexer input SMI coupled to the generator output OUT2 for receiving the digital signal DTS2, a multiplexer selection input MSI for receiving the first switch signal SWS1 and a multiplexer output MO coupled to the DAC input DI for supplying either (i) the digital signal DTS2 to the DAC input DI when the first switch signal SWS1 indicates a generator mode wherein a portion of the sigma-delta ADC is used for generating the analog output signal being the analog filtered signal ATS from the digital signal DTS2, or (ii) for coupling the quantizer output QO to the DAC input DI when the first switch signal SWS1 indicates a normal mode wherein the sigma-delta ADC is arranged for converting the analog input signal AIS into the digital data stream DOS.

In an embodiment, the sigma delta ADC comprises a first switch function arranged between the ADC input and the second subtractor input for preventing the analog input signal to reach the second subtractor input when the first switch signal indicates the generator mode. Such a switch function may actually be a controllable switch arranged between the ADC input and the second subtractor input to disconnect the second subtractor input from the ADC input. Alternatively, circuitry may be present between the ADC input and the subtractor input, or before the ADC input, which is switched into a high ohmic state.

In an embodiment, in the circuit which generates the analog output signal the sigma-delta ADC comprises a second switch S2 arranged between the filter output FO and the quantizer input QI for disconnecting the quantizer input QI from the filter output FO when the first switch signal SWS1 indicates the generator mode.

The digital waveform generator 5, which may be identical to the one shown in FIG. 2, supplies the digital signal DTS2 and a first switch control signal SWS1. The first switch control signal SWS1 indicates whether the analog portion 100 of the sigma-delta ADC has to operate in the normal mode wherein it acts as an analog to digital converter or in the generator mode wherein parts of the analog portion 100 are used together with the digital waveform generator 5 to generate the analog output signal ATS.

The blocks shown within the dashed block 100 are based on the analog portion 1 of the sigma-delta ADC as is shown in FIG. 1. The subtractor 14 is the subtractor 10 and the quantizer 16 is the quantizer 12 shown in FIG. 1. The filter 11 in FIG. 1 which has the transfer function H(s) has been replaced by the filter 15 which has the transfer function H'(s). The DAC 13 shown in FIG. 1 is now the DAC 17.

The multiplexer 34 has been added to supply the digital data stream DOS to the DAC 17 when in normal mode or to supply the second digital test signal DTS2 to the DAC 17 when in the generator mode. The switch 51 may be added to disconnect the non-inverting input of the subtractor 14 from the analog input signal AIS when in the generator mode such that the analog difference signal DS supplied to the filter 15 is the inverted output signal of the DAC 17. The filter 15 supplies the analog output signal ATS at output OUT3. The optional switch S2 may be added to disconnect the quantizer 16 from the output of the filter 15 to prevent the digital data stream DOS from disturbing the analog signal at the output out3. Alternatively, other measures may be taken to prevent the quantizer 16 to influence the analog output signal ATS, for example by adding a buffer (not shown) in the filter 15 which has a separate output supplying the analog output signal ATS. This separate output is not connected to the input of the quantizer 16.

Re-using building blocks of a sigma-delta ADC to obtain the analog output signal ATS in an integrated circuit which comprises a sigma-delta ADC has the advantage that only the digital waveform generator 5 has to be added and that the quality of the analog output signal ATS will be very high. In an embodiment this high quality of the analog output signal ATS is sufficient to test other similar sigma-delta ADC's using the same or a similar DAC 17.

Thus, re-using building blocks of a sigma-delta ADC to obtain the analog output signal ATS which has the correct properties to be used as an analog input signal of another sigma-delta ADC to be tested, may be implemented on chips which comprise a plurality of sigma-delta ADC's. In an embodiment, the circuits on the chip are arranged such that the DAC, subtractor and filter of at least two of the sigma-delta ADC's can be used to generate the analog output signal ATS. In this manner, the analog output signal ATS may be supplied by another one of the sigma-delta ADC's to the input of the sigma-delta ADC's to be tested. Or said differently, if the DAC, subtractor and filter of at least two of the plurality of the sigma-delta ADC's can be used together with the digital waveform test generator 5 to generate the analog output signal ATS, all the sigma-delta ADC's can be tested one by one or in groups using this analog output signal ATS.

Figure 4:
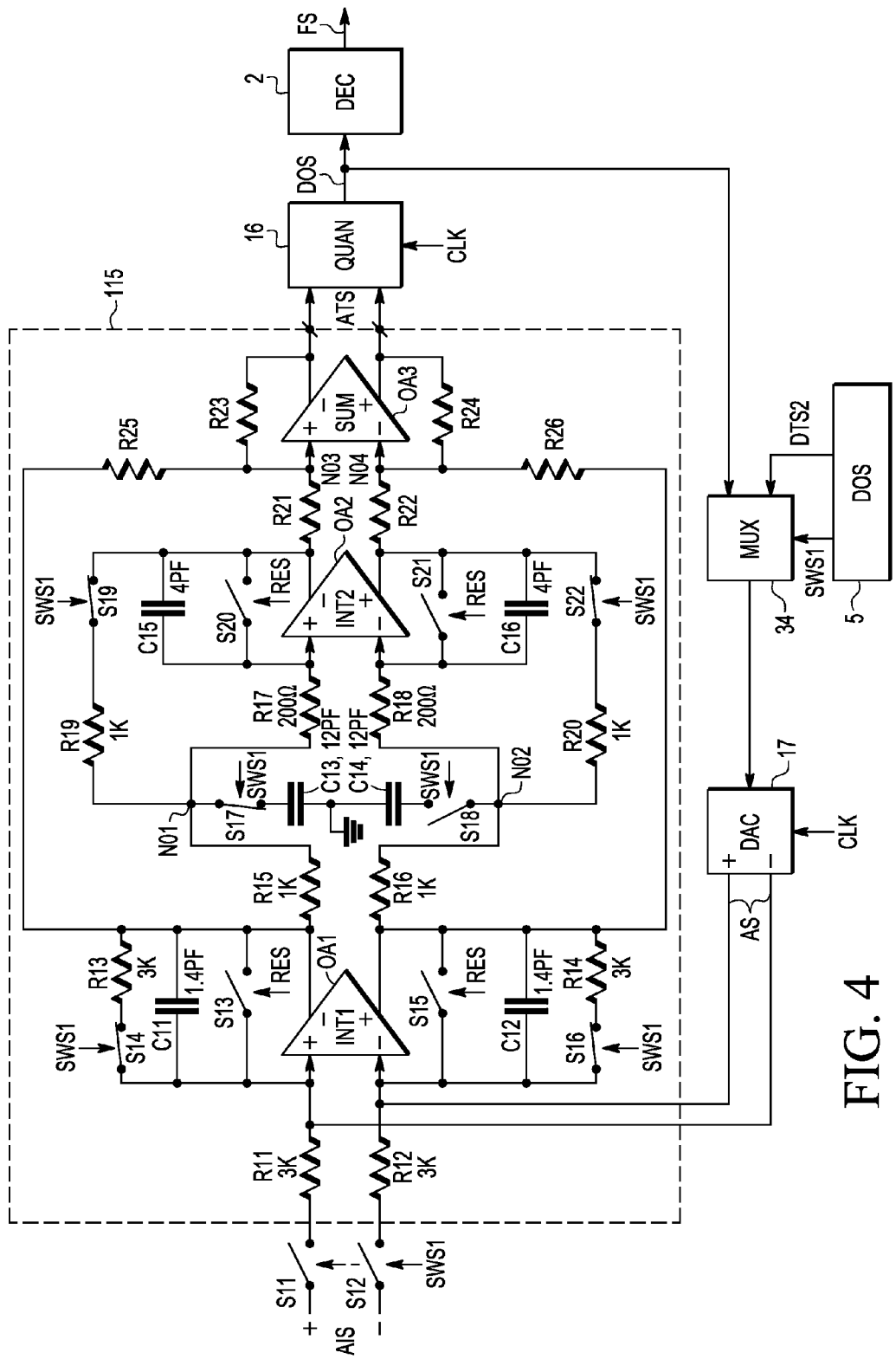

FIG. 4 schematically shows a more detailed block diagram of an embodiment of the circuit which generates the analog output signal using the filter of a sigma-delta ADC In the embodiment shown in FIG. 4, the digital waveform generator 5, the multiplexer 34, the DAC 17 and the quantizer 16 correspond to the same numbered blocks shown in FIG. 3. By way of example only, the signal lines are now doubled because differential signals are used. The switch 51 of FIG. 3 has been replaced by the two switches S11 and S12. The subtractor 14 of FIG. 3 has been omitted because the first opamp OA1 of the filter 115 also acts as an adder/subtractor.

Only the construction and operation of the filter 115 will be elucidated with respect to FIG. 4. All the other blocks have the same function as the corresponding blocks shown in and described with respect to FIGS. 1, 2 and 3. The filter 115 is the filter 11 of FIG. 1 with transfer function H(s) when in normal mode. The filter 115 is the filter 7 of FIG. 2 or the filter 15 of FIG. 3 when in generator mode. The switch signal SWS1 indicates whether the sigma-delta ADC is in normal mode or in generator mode. All the switches S11, S12, S14, S16, S17, S18, S19, S22 which are controlled by the switch signal SWS1 are shown in the position they have during the generator mode. The switches S13, S14, S20, S21 which are controlled by the reset signal RES are all in the position when the reset in inactive. The reset may be activated at a switch over from normal mode to generator mode or the other way around to speed up this transition by removing the charge on the integrator capacitors C11, C12, C15, C16. This removes the "history" of what went on when the circuit was in the other mode and thereby improves the performance.

The non-inverting input of the first opamp OA1 receives the analog input signal AIS via the switch S11 and the resistor R11 and is coupled to the inverting output of the DAC 17. The inverting input of the first opamp OA1 receives the analog input signal AIS via the switch S12 and the resistor R12, and is coupled to the non-inverting output of the DAC 17. The DAC 17 supplies the analog signal AS between its non-inverting and inverting outputs. In the embodiment shown, the DAC 17 supplies the analog signal AS as output currents which are converted into a differential input voltage of the opamp OA by the resistors R13 and R14. If the DAC 17 supplies the analog signal AS as output voltages, extra series resistors (not shown) may be required.

A parallel arrangement of a switch S13, a capacitor C11, and a series arrangement of the switch S14 and the resistor R13 are arranged between the non-inverting input and the inverting output of the opamp OA1. A parallel arrangement of a switch S15, a capacitor C12, and a series arrangement of the switch S16 and the resistor R14 are arranged between the inverting input and the non-inverting output of the opamp OA1. In normal mode, the switches S14 and S16 are open and the opamp OA1 with its associated components operates as an integrator.

In generator mode, the switches S14 and S16 are closed to obtain a low pass filter. In an embodiment, by way of example only, in the generator mode, the low pass filter has unity gain and a 3 dB bandwidth of about 37 MHz with a roll off of 20 dB per decade.

A resistor R15 is arranged between the inverting output of the opamp OA1 and a node NO1. A resistor R16 is arranged between the non-inverting output of the opamp OA1 and a node NO2. A series arrangement of a switch S17 and a capacitor C13 is arranged between the node NO1 and a reference voltage. A series arrangement of a switch S18 and a capacitor C14 is arranged between the node NO2 and the reference voltage. The non-inverting input of the opamp OA2 receives the signal at the node NO1 via the resistor R17. The inverting input of the opamp OA2 receives the signal at the node NO2 via the resistor R18.

A parallel arrangement of a switch S20 and a capacitor C15 is arranged between the non-inverting input of the opamp OA2 and the inverting output of the opamp OA2. A series arrangement of the switch S19 and the resistor R19 is arranged between the inverting output of the opamp OA2 and the node NO1. A parallel arrangement of a switch S21 and a capacitor C16 is arranged between the inverting input of opamp OA2 and the non-inverting output of the opamp OA2. A series arrangement of the switch S20 and the resistor R20 is arranged between the non-inverting output of the opamp OA2 and the node NO2.

In normal mode, when the switches S17, S18, S19, S20 are open, the opamp OA2 with the associated components acts as an integrator. In generator mode, when the switches S17, S18, S19, S22 are closed, a multi-feedback low-pass filter with unity DC-gain is obtained. This provides a two pole or −40 dB per decade amplitude response. The combination of the two amplifiers provides three poles with minimal additions relative to the two integrators in normal mode. The indicated values of the components are by way of example only and will depend on the actual application.

A resistor R21 is arranged between the inverting output of the opamp OA2 and a node NO3. A resistor R22 is arranged between the non-inverting output of the opamp OA2 and a node NO4. A resistor R23 is arranged between the inverting output of the third opamp OA3 and the node NO3. A resistor R24 is arranged between the non-inverting output of the opamp OA3 and the node NO4. The resistor R25 is arranged between the node NO3 and the inverting output of the opamp OA1. The resistor R26 is arranged between the node NO4 and the non-inverting output of the opamp OA1. The opamp OA3 with its associated components acts as a summing amplifier which may have unity gain and then acts as a buffer.

The analog test signal ATS is supplied between the inverting and non-inverting outputs of the opamp OA3 to the quantizer 16. The quantizer 16 supplies the digital data stream DOS to the digital filters 2 and to the multiplexer 34. In normal mode, the multiplexer 34 feeds the output signal of the quantizer 16 to the input of the DAC 17. In generator mode, the multiplexer 34 supplies the digital test signal DTS2 to the DAC 17.

In an embodiment, the switches S11, S12, S14, S16, S17, S18, S19, S22 may be semiconductor switches. Closed switches may be obtained by a conductive transistor, open switches may be obtained by non-conductive transistors or a floating state of a tri-state output. Although in FIG. 4 a second order system has been shown using the two opamps OA1 and OA2 for simplicity, any higher order systems with more than two opamps acting as integrators in normal mode and as low-pass filters in generator mode may be implemented. Alternatively, depending on the application, a first order system may suffice. In an embodiment, further components and switches may be added to the summing amplifier using opamp OA3 which change the summing topology into a combined summing and low-pass operation during the generator mode.

The bandwidth of the low-pass filters, their roll off and the amplification factor depend on the application envisaged and can be found by calculation, simulation or experimentation. Although a feed forward system is shown, alternatively a feedback topology could be implemented to obtain the same transfer function H'(s). Thus, the embodiment of the combination of the transfer functions H(s) and H'(s) shown in FIG. 4 should be considered to be an example only of how in an efficient manner the transfer function H'(s) can be obtained by slightly modifying the already present filter 11 with transfer function H(s). However, any topology which in the normal mode provides the transfer function H(s) and in the generator mode the transfer function H'(s) could be implemented. It is very efficient with respect to the chip area to re-use the already present filter transfer function H(s) in the sigma-delta ADC. Further, such a filter which has already the high quality to be used in the sigma-delta ADC will when reused in slightly different form for the generation of the analog output signal ATS provide a high quality analog output signal.

Alternatively, as discussed hereinbefore the transfer function H(s) need not be obtained by using integrator(s). Thus, in an embodiment, the transfer function H(s) may be realized by using low pass filter(s) which may be identical to the ones used in the transfer function H'(s) such that the transfer functions H'(s) and H(s) and their realisation are identical.

The number of bits of the digital data stream DOS is not indicated In FIG. 4. The actual number of bits and the coding used is not relevant to the invention. In an embodiment, the quantizer may supply 16 thermometer coded bits to represent 17 levels. These thermometer coded bits may also be forwarded by the multiplexer 34 to be processed by the DAC 17. If required for other digital blocks, the thermometer coded bits may be converted by a binary encoder into any suitable binary representation, such as for example, a 5 bit 2's-complement representation.

A buffer may be added if the output drive capabilities of the summing amplifier OA3 are not sufficient to drive a large off chip load.

Figure 5:
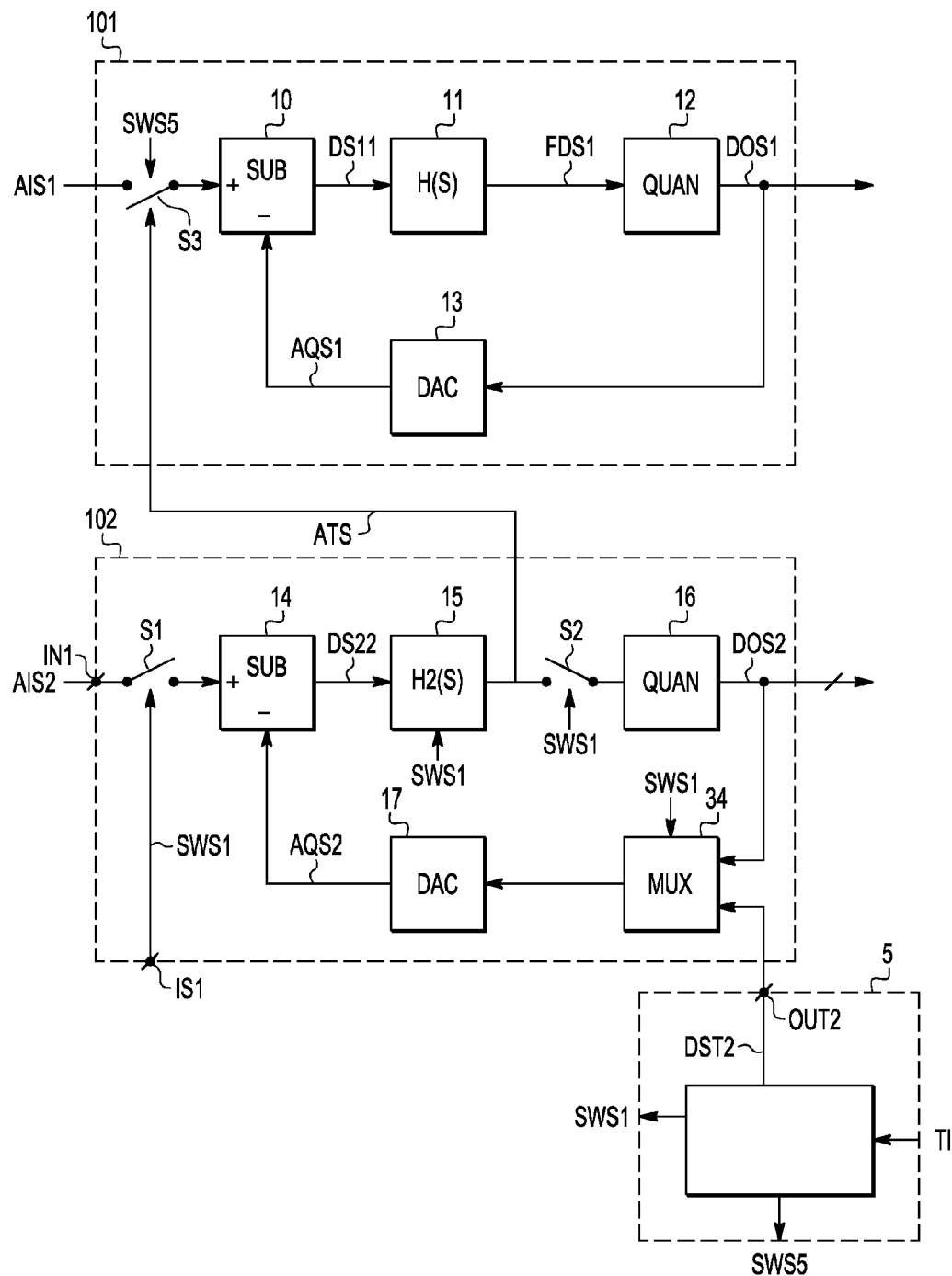

FIG. 5 schematically shows a block diagram of two sigma-delta ADC's, a portion of one of the sigma-delta ADC's is used in the circuit which generates the analog output signal to obtain the analog test signal suitable to test the other sigma-delta ADC.

The sigma-delta ADC, which comprises the block 101, is the ADC which has to be tested. This sigma-delta ADC is referred to in the now following as the DUT-ADC (Device Under Test-ADC). The other sigma-delta ADC, which comprises the blocks 102, is the ADC of which a portion is used to generate the analog test signal ATS. This sigma-delta ADC is referred to in the now following as the G-ADC (Generator-ADC).

The block 101 is the block 1 of FIG. 1 to which the switch S3 has been added such that the input signal to the non-inverting input of the subtractor 10 may be selected to be the analog input signal AIS1 to be digitized in normal mode or the analog test signal ATS generated by the G-ADC.

The analog block 102 of the G-ADC is based on block 100 of FIG. 3, the only difference is that the filter 15 with transfer function H2(s) is controlled by the switch signal SWS1 to have the transfer function H(s) when the G-ADC is in normal mode and to have the transfer function H'(s) when the G-ADC is in the generator mode.

The digital waveform test generator 5 receives the test signal select signal TI and supplies the digital test signal DTS2 at the output OUT2 and the switch signals SWS1 and SWS5. The digital waveform test generator 5 may be based on the one shown in FIG. 2 wherein the selection controller 55 now also generates the switch signal SWS5 in response to the test signal select signal TI. If the G-ADC has to operate in the normal mode: SWS1 should control the switch S1 and the optional switch S2 to be closed, the multiplexer 34 to select the digital data stream DOS2, and the filter 15 such that its transfer function H2(s) becomes H(s) which has the integrating properties as elucidated with respect to FIG. 4. If, as is drawn in FIG. 5, the G-ADC operates in the generator mode, the switch signal SWS1 controls the switches S1 and S2 to open, the multiplexer 34 to select the digital test signal DTS2 and the filter 15 such that its transfer function H2(s) becomes H'(s) which has the low-pass filter characteristics as explained with respect to FIG. 4.

Instead of the switch S2, an extra opamp summing circuit or summing buffer (not shown) may be implemented which has inputs connected to the nodes NO3 and NO4 (FIG. 4) and a separate output to supply the analog output signal ATS.

If the G-ADC is selected to operate in the generator mode, it further has to be indicated by the test signal select signal TI that the analog test signal ATS has to be supplied to the input of the DUT-ADC and the switch S3 is controlled by the switch signal SWS 5, to select the analog test signal ATS.

The analog test signal ATS which is suitable to test the analog part 101 of the delta-sigma ADC can be generated by adding the DAC 17 and a filter 15 with the transfer function H'(s) to the digital waveform test generator 5. In an integrated circuit in which multiple sigma-delta ADC's are present, the DAC 17 and the filter 15 are part of one of the sigma-delta ADC's which has not to be tested. The filter 15 may be based on the same filter 11 (see FIG. 1) as already used in a sigma-delta ADC to filter the difference signal DS of the analog input signal AIS and the DAC 13 output signal. The filter 15 may have provisions to change its transfer function from an integrating function H(s) into a low-pass function H'(s).

The analog output signal ATS is also referred to as the analog filtered signal ATS as occurring in a sigma-delta ADC.

In an embodiment, the circuit for generating the analog output signal further comprises a circuit to be tested 101, 102 having a further input IN3 for receiving the analog filtered signal ATS as a test signal.

In an embodiment, the circuit to be tested is a further sigma-delta ADC 101, 201 comprising an analog portion 101 comprising: a further ADC input IN2 for receiving a further analog input signal AIS1, a further subtractor 10 coupled to the further ADC-input IN2 and to an output of a further DAC 13 for subtracting an analog quantized signal AQS1 supplied by the further DAC 13 from the analog filtered signal ATS to obtain an analog difference signal DS11, a further analog filter 11 coupled to the further subtractor 10 for filtering the analog difference signal DS11 into a filtered difference signal FDS1, a further quantizer 12 coupled to the further analog filter 11 for receiving the filtered difference signal FDS1 and coupled to the second DAC 13 for supplying a further digital data stream DOS1 to the further DAC 13, and the further DAC13 being arranged to convert the further digital data stream DOS1 into the analog quantized signal AQS1, wherein the integrated circuit is arranged for receiving the analog filtered signal ATS as the analog difference signal DS11.

In an embodiment, the further sigma-delta ADC comprises a third switch S3 being arranged for coupling the further analog input signal AIS1 to the subtractor 10 in the normal mode wherein the further sigma-delta ADC is arranged for converting the further analog input signal AIS1 into the further digital quantized stream DOS1, or for coupling the analog filtered signal ATS to the subtractor 10 in the generator mode when the analog portion 101 of the further sigma-delta ADC is tested by applying the analog filtered signal ATS.

In an embodiment, the first mentioned analog filter 15 has a transfer function H'(s) being switchable in response to the first switch signal SWS1 between on the one hand an integrating function when the first switch signal SWS1 indicates that the first mentioned sigma-delta ADC 102 is in its normal mode and on the other hand a low-pass filter function when the first switch signal SWS1 indicates that the first mentioned sigma-delta ADC 102 is in its generator mode.

In an embodiment, the first mentioned analog filter 15 comprises filter circuitry equal to the circuitry of the further analog filter 11, the filter circuitry comprising integrating capacitors C11, C12, C15, C16 to obtain integrating properties and additional provisions for changing the transfer function H'(s) into a low-pass filter in response to the first switch signal SWS1 indicating that the first mentioned sigma-delta ADC 102 is in its generator mode, the additional provisions comprising resistors R13, R14, R19, R20 and associated switches S14, S16, S19, S22 being arranged for coupling the resistors R13, R14, R19, R20 in parallel with the associated integrator capacitors C11, C12, C15, C16 when the first switch signal SWS1 indicates that the first mentioned sigma-delta ADC 102 is in its generator mode.

In an embodiment, the first mentioned analog filter 15 is identical to the further analog filter 11, both having low-pass filter characteristics.

In an embodiment, the digital waveform generator 5 further comprises: a clock generator 54 for supplying a clock signal CLK, and a controller 55 comprising a controller input CI for receiving an input control signal TI and being coupled to the clock generator 54, and wherein the controller 55 is arranged for controlling the clock generator 54 to control a repetition frequency of the clock signal CLK for obtaining the second particular bit rate RM to correspond to a bit rate of the digital data stream DOS1 and for controlling the digital generator 9 to obtain the second particular number of bits M to correspond to the number of bits of the digital data stream DOS1.

In an embodiment, the system comprises the circuit for generating the analog output signal and a further circuit comprising an input for receiving the analog output signal being the analog filtered signal ATS.

In an embodiment, the circuit for generating the analog output signal and the further circuit are integrated on a same chip.

In an embodiment, the first mentioned circuit and the further sigma-delta ADC are integrated on a same chip.

In an embodiment, the digital waveform generator 5 is arranged for generating the digital test signal DTS2 to obtain the analog output signal ATS being a test signal for testing a sigma-delta ADC 101.

In an embodiment, a method is defined of generating an analog output signal by using a part of a sigma-delta ADC 100, the method comprises: generating 5 a digital signal DTS2, and a sigma-delta Analog to Digital conversion 100 comprising receiving IN1 an analog input signal AIS2, receiving IS1 a first switch signal SWS1, filtering 15 an analog filter input signal DS22 to obtain an analog filtered signal ATS, quantizing 16 the analog filtered signal ATS into a digital data stream DOS2, digital to analog converting 17 a DAC input signal into a DAC output signal, subtracting 14 the DAC output signal from a further subtractor input signal to supply the analog filter input signal DS22, selecting S1 the further subtractor input signal to be the analog input signal AIS when the first switch signal SWS1 indicates a normal mode wherein the sigma-delta ADC is arranged for converting the analog input signal AIS into the digital data stream DOS or to disconnect the analog input signal AIS from the further subtractor input signal when the first switch signal SWS1 indicates a generator mode wherein a portion of the sigma-delta ADC is used for generating the analog iltered signal ATS from the digital signal DTS2, and selecting 34 the DAC input signal to be either (i) the digital data stream DOS when the first switch signal SWS1 indicates the normal mode, or (ii) the digital signal DTS2 when the first switch signal SWS1 indicates the generator mode.

In an embodiment, a method is defined wherein the generating the digital signal DTS2 comprises generating a digital test signal to obtain the analog output signal ATS being a test signal for testing a sigma-delta ADC 101.

In the foregoing specification, the invention has been described with reference to specific examples of embodiments of the invention. It will, however, be evident that various modifications and changes may be made therein without departing from the scope of the invention as set forth in the appended claims.

Although it is common practice to refer to the circuit 1 shown in FIG. 1 as a sigma-delta ADC, it may also be referred to in literature as the analog portion of a sigma-delta ADC, or as delta-sigma ADC.

For example, a plurality of Continuous Time Sigma-Delta Analog to Digital Converters may be integrated in a single chip without having direct access to the ADC inputs at package pins. The testing of such ADC's may become very difficult without the test signal generator being available on the chip. Even if the test signal generator is present on the chip, it is a challenge to provide test signals which enable testing of the ADC to its full performance. The test signal generator was earlier referred to as "the circuit generating the analog output signal by using a part of a sigma-delta ADC" and comprises the digital waveform generator 9, optionally the digital sigma-delta modulator 53 to generate together the digital test signal DTS2, and the DAC 6 or 17 together with the analog filter 7 or 15 to generate the analog output signal ATS. The digital waveform generator 9 may be a Direct Digital Synthesizer (DDS). Although the signal generator is suitable to test a sigma-delta ADC it may be used to test other blocks on the chip which are also isolated from the package pins, or even to test other blocks off the chip, such as for example interface blocks. The test generator may be used for production tests, but also for self-test in the system for monitoring functions as is required by safety standards such as ISO26262.

For example, the sigma-delta ADC integrated on the chip may be a multi-bit, third order continuous time sigma-delta modulator with a cascade of resonators.

The high quality test signal with sufficiently high performance specifications is obtained by re-using the high quality DAC 13 and filter 11 already present with the correct performance specification in the sigma-delta ADC. The filter characteristics may be changed slightly to change the integrating properties during normal operation of the sigma-delta ADC into low-pass properties when used as the smoothing filter in the test generator. The digital waveform generator 9 has to supply a digital signal to the DAC 13 which has the same format as the digital signal (the digital data stream DOS) at the output of the quantizer 12 of the sigma-delta ADC. In this manner, the quality of the signal at the input and thus the output of the DAC will be at the same high level as in the sigma-delta ADC to be tested. In fact, the digital sigma-delta modulator 53 together with the DAC 6 and the filter 7 recreates the input signal at the input of the subtractor 10. This is the same as if the DAC 6 and filter 7 were used with a digital signal to create a sigma-delta DAC. Such a sigma-delta DAC would have the high performance required and subsequently, the test generator will have the same high performance. In an embodiment wherein the same DAC 6 and filter 7 are used as used in one of the sigma-delta ADC's on the chip, the performance of the test generator will automatically be sufficiently high to test the sigma-delta ADC's. If the sigma-delta ADC's on the chip have different performance, the DAC and filter of the ADC with the highest performance is used. In an embodiment wherein the DAC and filter of one of the sigma-delta ADC's is used in the test generator, the extra chip area required for the test generator is relatively small because no extra chip area is required for the DAC and only minor additions (a few resistors, capacitors and switches) are required to change the transfer function of the filter from that of integrators (resonators) into low-pass filters. For example the response of the integrators may be changed into second order multi-feedback low-pass filters. Also the summing amplifier OA3 may become a second order multi-feedback low-pass filter. In this particular implementation, the first integrator around the opamp OA1 may become a single pole filter to improve parasitic loading at critical nodes.

In an embodiment, with very little addition in circuit complexity and component area on the chip it is possible to change a third order sigma-delta ADC into a sigma-delta DAC with 7 poles of filtering. It should be noted that depending on the application any other combination of low-pass filters is possible. The first integrator with opamp OA1 could be changed to also become a multi-feedback filter to create 8 poles.

The quantizer 12 may be a 4 bit flash ADC and the DAC 13 may be a 4 bit current steering DAC. However, alternative the ADC and DAC may be single bit or any other number of bits quantizer and DAC. Other quantizer and DAC implementations may be used.

Because the apparatus implementing the present invention is, for the most part, composed of electronic components and circuits known to those skilled in the art, circuit details have not been explained in any greater extent than that considered necessary, for the understanding and appreciation of the underlying concepts of the present invention and in order not to obfuscate or distract from the teachings of the present invention.

Furthermore, although FIGS. 2 and 5 and the discussion thereof describe an exemplary circuit for generating an analog output signal by using a part of a sigma-delta ADC, which analog output signal may be used to test a sigma-delta ADC, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between analog and logic blocks are merely illustrative and that alternative embodiments may merge analog or logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, the illustrated elements in each one of the Figures may be located on a single integrated circuit or within a same device. Alternatively, the illustrated elements may include any number of separate integrated circuits or separate devices interconnected with each other. For example, the system shown in FIG. 5 may be located on a same integrated circuit or on a separate integrated circuit within a same package. Or even in separate packages. If the analog test signal ATS and the digital signals DTS1 and DTS2 are used on another chip, they may be first buffered.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A circuit for generating an analog output signal by using a part of a sigma-delta ADC in a generator mode or for operating as a sigma-delta ADC in a normal mode, the circuit comprising a digital waveform generator and a sigma-delta ADC:

the digital waveform generator having a generator output for supplying a digital signal,
the sigma-delta ADC comprising:
an ADC input for receiving an analog input signal,
a switch input for receiving a first switch signal,
an analog filter comprising a filter input, and a filter output for supplying an analog filtered signal,
a quantizer comprising a quantizer input coupled to the filter output for receiving the analog filtered signal and a quantizer output for converting the analog filtered signal into a digital data stream,
a DAC comprising a DAC input and a DAC output, and
a subtractor comprising a first subtractor input coupled to the DAC output, a second subtractor input coupled to the ADC input via a first switch and a subtractor output being coupled to the filter input, and the circuit comprising
a multiplexer comprising a first multiplexer input coupled to the quantizer output for receiving the digital data stream, a second multiplexer input coupled to the generator output for receiving the digital signal, a multiplexer selection input for receiving the first switch signal and a multiplexer output coupled to the DAC input for supplying either (i) the digital signal to the DAC input when the first switch signal indicates the generator mode wherein the part of the sigma-delta ADC used for generating the analog output signal comprises the analog filter and the analog output signal is output from the circuit, or (ii) for coupling the quantizer output to the DAC input when the first switch signal indicates the normal mode wherein the sigma-delta ADC is arranged for converting the analog input signal into the digital data stream.

2. A circuit as claimed in claim 1, wherein the sigma delta ADC comprises a first switch function arranged between the ADC input and the second subtractor input for preventing the analog input signal reaching the second subtractor input when the first switch signal indicates the generator mode.

3. A circuit as claimed in claim 1, wherein the sigma-delta ADC comprises a second switch arranged between the filter output and the quantizer input for disconnecting the quantizer input from the filter output when the first switch signal indicates the generator mode.

4. A circuit as claimed in claim 1, further comprising a circuit to be tested, the circuit to be tested having a further input for receiving the analog filtered signal as a test signal.

5. A circuit as claimed in claim 4, wherein the circuit to be tested is a further sigma-delta ADC comprising an analog portion comprising:
 a further ADC input for receiving a further analog input signal,
 a further subtractor coupled to the further ADC-input and to an output of a further DAC for subtracting an analog quantized signal supplied by the further DAC from the analog filtered signal to obtain an analog difference signal,
 a further analog filter coupled to the further subtractor for filtering the analog difference signal into a filtered difference signal,
 a further quantizer coupled to the further analog filter for receiving the filtered difference signal and coupled to the second DAC for supplying a further digital data stream to the further DAC, and
 the further DAC being arranged to convert the further digital data stream into the analog quantized signal, wherein the circuit is arranged for receiving the analog filtered signal as the analog difference signal.

6. A circuit as claimed in claim 5, wherein the further sigma-delta ADC comprises a third switch being arranged for coupling the further analog input signal to the subtractor in the normal mode wherein the further sigma-delta ADC is arranged for converting the further analog input signal into the further digital quantized stream, or for coupling the analog filtered signal to the subtractor in the generator mode when the analog portion of the further sigma-delta ADC is tested by applying the analog filtered signal.

7. A circuit as claimed in claim 5, wherein the first mentioned analog filter has a transfer function H'(s) switchable in response to the first switch signal between an integrating function when the first switch signal indicates that the first mentioned sigma-delta ADC is in normal mode and a low-pass filter function when the first switch signal indicates that the first mentioned sigma-delta ADC is in generator mode.

8. A circuit as claimed in claim 7, wherein the first mentioned analog filter comprises filter circuitry equal to the circuitry of the further analog filter, the filter circuitry comprising integrating capacitors to obtain integrating properties and additional provisions for changing the transfer function H'(s) into a low-pass filter in response to the first switch signal indicating that the first mentioned sigma-delta ADC is in generator mode, the additional provisions comprising resistors and associated switches being arranged for coupling the resistors in parallel with the associated integrator capacitors when the first switch signal indicates that the first mentioned sigma-delta ADC is in generator mode.

9. A circuit as claimed in claim 7, wherein the first mentioned analog filter is identical to the further analog filter, both having low-pass filter characteristics.

10. A circuit as claimed in claim 1, wherein the digital waveform generator further comprises:
 a clock generator for supplying a clock signal, and
 a controller comprising a controller input for receiving an input control signal and being coupled to the clock generator, and wherein the controller is arranged for controlling the clock generator to control a repetition frequency of the clock signal for obtaining the second particular bit rate to correspond to a bit rate of the digital data stream and for controlling the digital generator to obtain the second particular number of bits to correspond to the number of bits of the digital data stream.

11. A system comprising the circuit as claimed in claim 1 and a further circuit comprising an input for receiving the analog output signal being the analog filtered signal.

12. A system as claimed in claim 4, wherein the circuit for generating the analog output signal and the circuit to be tested are integrated on a same chip.

13. A system as claimed in claim 5, wherein the circuit for generating the analog output signal and the further sigma-delta ADC are integrated on a same chip.

14. A system as claimed in claim 1, wherein the digital waveform generator is arranged for generating the digital test signal to obtain the analog output signal being a test signal for testing a sigma-delta ADC.

15. A method of generating an analog output signal by using a part of a sigma-delta ADC in a generator mode or for performing a sigma-delta ADC operation in a normal mode, the method comprising:
 generating a digital signal, and
 a sigma-delta Analog to Digital conversion comprising:
 receiving an analog input signal,
 receiving a first switch signal,
 filtering an analog filter input signal with an analog filter to obtain an analog filtered signal,
 quantizing the analog filtered signal into a digital data stream,
 digital to analog converting a DAC input signal into a DAC output signal,
 subtracting the DAC output signal from a further subtractor input signal to supply the analog filter input signal,
 selecting the further subtractor input signal to be the analog input signal when the first switch signal indicates the normal mode wherein the sigma-delta ADC is arranged for converting the analog input signal into the digital data stream or to disconnect the analog input signal from the further subtractor input signal when the first switch signal indicates the generator mode wherein the part of the sigma-delta ADC used for generating the analog output signal comprises the analog filter and the analog output signal is output, and
 selecting the DAC input signal to be either (i) the digital data stream when the first switch signal indicates the normal mode, or (ii) the digital signal when the first switch signal indicates the generator mode.

16. A method as claimed in claim 15, wherein the generating the digital signal comprises generating a digital test signal to obtain the analog output signal, and wherein the analog output signal is used as a test signal for testing a sigma-delta ADC.

17. A method as claimed in claim 15, further comprising disconnecting the quantizer input from the filter output with a second switch arranged between the filter output and the quantizer input when the first switch signal indicates the generator mode.

18. A first sigma-delta ADC circuit configured to transition between a normal mode and a generator mode configured to output an analog output signal, the first sigma-delta ADC circuit configured to transition between the normal mode and the generator mode in response to a first switch signal, the first sigma-delta ADC circuit comprising:

an ADC input for receiving an analog input signal, a switch input for receiving a first switch signal, an analog filter comprising a filter input, and a filter output for supplying an analog filtered signal, a quantizer comprising a quantizer input switchably coupled to the filter output for receiving the analog filtered signal and a quantizer output for converting the analog filtered signal into a digital data stream, a DAC comprising a DAC input and a DAC output, a subtractor comprising a first subtractor input coupled to the DAC output, a second subtractor input coupled to the ADC input via a first switch and a subtractor output coupled to the filter input, and a multiplexer comprising a first multiplexer input coupled to the quantizer output for receiving the digital data stream, a second multiplexer input for receiving a digital signal, and a multiplexer output coupled to the DAC input, the multiplexer configured to supply the digital signal to the DAC input in generator mode and to coupling the quantizer output to the DAC input in normal mode, wherein the analog filter is used to generate the analog output signal and the analog output signal is output from the circuit in generator mode, and wherein the first sigma-delta ADC circuit is configured to convert the analog input signal into the digital data stream in normal mode.

19. A first sigma-delta ADC circuit as claimed in claim 18, further comprising a second switch interposed between the filter output and the quantizer input, and configured to disconnect the quantizer input from the filter output when the first sigma-delta ADC circuit is in generator mode.

20. A first sigma-delta ADC circuit as claimed in claim 18, wherein the first sigma-delta ADC circuit is further configured output the analog output signal to a second sigma-delta ADC circuit in generator mode to test the second sigma-delta ADC circuit.

* * * * *